(12) United States Patent
Huang

(10) Patent No.: US 8,319,310 B2
(45) Date of Patent: Nov. 27, 2012

(54) FIELD EFFECT TRANSISTOR GATE PROCESS AND STRUCTURE

(75) Inventor: Jenn Hwa Huang, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 400 days.

(21) Appl. No.: 12/415,037

(22) Filed: Mar. 31, 2009

(65) Prior Publication Data
US 2010/0244178 A1 Sep. 30, 2010

(51) Int. Cl.
*H01L 29/47* (2006.01)
(52) U.S. Cl. ........ 257/472; 257/280; 257/283; 257/288; 257/473; 257/478
(58) Field of Classification Search .................. None
See application file for complete search history.

(56) References Cited

U.S. PATENT DOCUMENTS

| | | | | |
|---|---|---|---|---|
| 4,351,706 A | * | 9/1982 | Chappell et al. | 205/655 |
| 5,688,703 A | | 11/1997 | Klingbeil, Jr. et al. | |
| 5,923,072 A | * | 7/1999 | Wada et al. | 257/473 |
| 5,939,737 A | * | 8/1999 | Hirano | 257/194 |
| 6,057,566 A | | 5/2000 | Eisenbeiser et al. | |
| 6,629,879 B1 | * | 10/2003 | Kim et al. | 451/57 |
| 2008/0105901 A1 | * | 5/2008 | Tabatabaie et al. | 257/194 |

OTHER PUBLICATIONS

Martinez, M.J., et al., P-HEMTs for Low-Voltage Portable Applications Using Filled Gate Fabrication Process, GaAs IC Symposium, 1996.

Nozaki, C., et al., Failure analysis of electrostatic discharge in GaAs/AlGsAs PHEMTs, Toshivba Corp. 2002.

Fanning, D.,et al., Dieletrically defined optical T-gate for high power GaAs pHEMTs, 2002 GaAsMANTECH conference.

Tkachenko, Y., et al., The effect of gate recess width on the linearity of GaAs MESFETs, 0-7803-4194, IEEE, May 1997.

Tkachenko, Y., et al., The correlation between inter-modualtion distortion of GaAs MESFETs and ungated recess width, IEEE GaAs IC Symposium 1999.

Tkachenko, Y., et al., Correlation between un-gated recess width and linearity of GaAs MESFETs (Technologies for Wireless Applications: Past, Present and Future) Microwave Journal, Jul. 1999.

* cited by examiner

*Primary Examiner* — N Drew Richards
*Assistant Examiner* — Kyoung Lee
(74) *Attorney, Agent, or Firm* — Sherry W. Schumm

(57) ABSTRACT

A Schottky gate (27', 27") of a metal-semiconductor FET (20', 20") is formed on a semiconductor comprising substrate (21) by, etching a gate recess (36) so as to expose a slightly depressed surface (362) of the substrate (21), the etching step also producing surface undercut cavities (363) extending laterally under the etch mask (43) from the gate recess (36), then conformally coating the slightly depressed surface (362) with a first Schottky forming conductor (40') and substantially also coating inner surfaces (366) of the surface undercut cavities (363), and forming a Schottky contact to the semiconductor comprising substrate (21), adapted when biased to control current flow in a channel (22) extending between source (23) and drain (24) of the FET (20', 20") under the gate recess (36). In further embodiments, a conformal or non-conformal barrier layer conductor (41', 41") may be provided over the Schottky forming conductor (40') and a thicker overlying gate conductor (442, 272) provided over the barrier layer conductor (41', 41").

20 Claims, 7 Drawing Sheets

FIELD EFFECT TRANSISTOR GATE PROCESS AND STRUCTURE

FIELD OF THE INVENTION

The present invention generally relates to electronic devices, more particularly, field effect transistors (FETs), especially metal-semiconductor field effect transistors (MESFETs).

BACKGROUND OF THE INVENTION

Metal-semiconductor field effect transistors (MESFETs) are much used in modern day electronics, especially high frequency devices employing binary or ternary III-V semiconductors. GaAs, AlGaAs, InGaAs, AlInAs, and other combinations are non-limiting examples of materials commonly used in such devices. Such combination of semiconductor epitaxial layers can create devices with high electron mobility and are often referred to as high electron mobility transistors (HEMT), pseudomorphic high electron mobility transistors (PHEMT) or metamorphic high electron mobility transistors (MHEMT).

FIG. 1 shows a simplified schematic cross-sectional view through generalized MESFET device 20, 20', 20" comprising, semiconductor containing substrate 21 extending to interface 19, source-drain regions 23, 24 with their associated contacts 25, 26, and gate 27. Gate 27 commonly comprises Schottky contact forming conductor 271 in contact with portion or region 211 of substrate 21 and overlying conductor 272. Overlying conductor 272 commonly comprises multiple layers of metals provided to serve as a diffusion barrier and to reduce the gate resistance. Portion or region 211 of semiconductor containing substrate 21 is also referred to as Schottky contact forming region 211 and contains or abuts semiconductor channel 22 whose conductivity is modulated by the voltage applied to gate 27, thereby controlling the current flowing between source 23 and drain 24 through channel 22. Substrate 21 may be a monolithic semiconductor or a complex layered structure involving regions formed from different semiconductor materials, as for example but not limited to those mentioned above. Complex substrates 21 are much used for HEMT, PHEMT and MHEMT devices. The construction and operation of such MESFET devices are well known in the art. For example, multilayered HEMT devices are described in commonly held U.S. Pat. No. 6,057,566.

The present disclosure is concerned with the structure and method of formation of gate 27 in relations to underlying Schottky contact forming semiconductor region 211 of substrate 21, and does not depend on the internal details of substrate 21 beneath region 211. Accordingly, substrate 21 may have any combination of internal layers and/or materials desired by the designer, depending upon the particular kind of FET device being fabricated, including but not limited to simple MESFETs, HEMTs, PHEMTs, MHEMTs and other junction field effect devices. Despite their great utility, FET devices of various kinds continue to suffer from a number of problems which limit their operating properties or reliability or both. Accordingly, there is an ongoing need for improved FET structures and manufacturing methods, especially those useful for high frequency applications employing Schottky contacts to III-V containing semiconductors.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
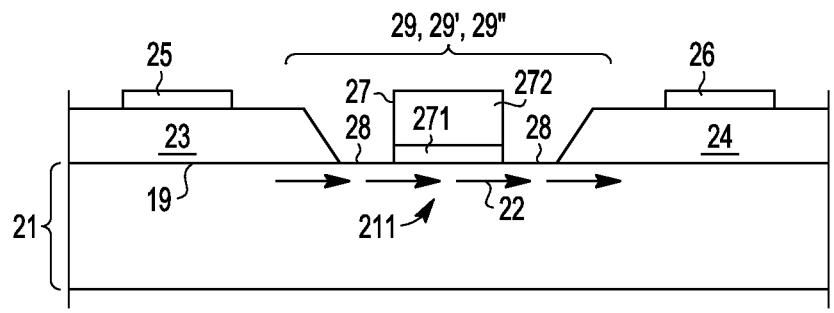
FIG. 1 shows a simplified schematic cross-sectional view through a generalized MESFET device, as for example but not limited to HEMT, PHEMT or MHEMT devices.
Figure 2:
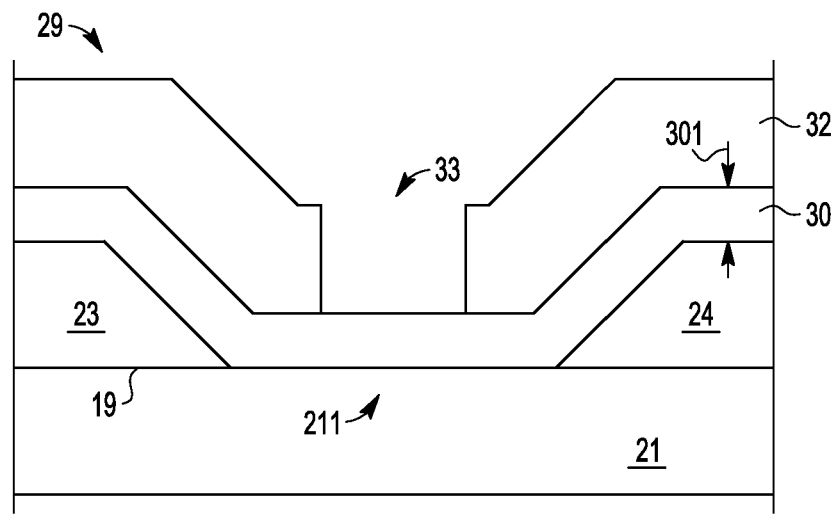
FIGS. 2-7 are simplified schematic cross-sectional views of the gate region of a MESFET device such as is illustrated in FIG. 1, during different stages of manufacture according to the prior art.
Figure 3:
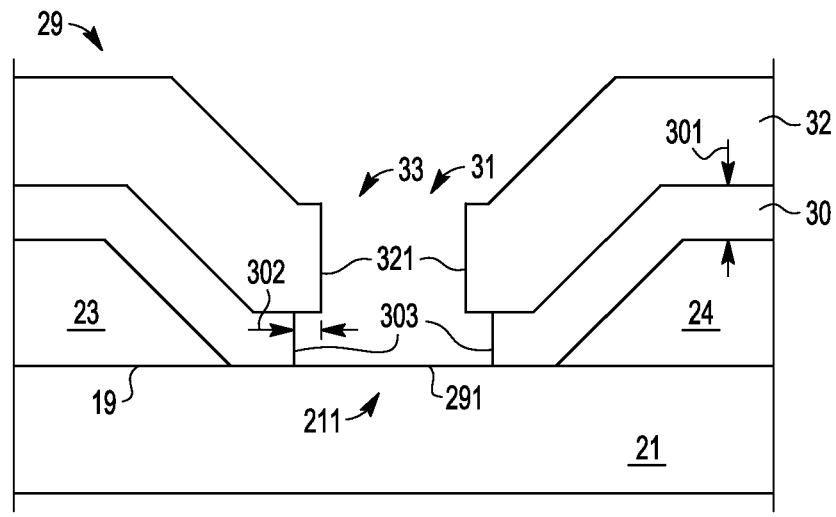

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences or arrangements other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

The terms "semiconductor" (abbreviated as "SC") and "semiconductor substrate" are intended to include any type of semiconductor, whether organic or inorganic, to encompass type IV, type III-V and type II-VI materials and to encompass amorphous, polycrystalline and single crystal materials and combinations thereof, as well as composite or layered arrangements such as for example and not intended to be limiting, semiconductor-on-insulator (SOI) structures and various layered combinations such as are, for example, commonly used in HEMT, PHEMT and MHEMT devices. Various embodiments are described herein for GaAs containing semiconductors, but persons of skill in the art will understand that this is merely for convenience of explanation and not intended to be limiting and that any semiconductor material can be used, including those enumerated above. Further, various exemplary dielectric and conductor materials are mentioned by way of illustration of preferred embodiments, but are not intended to be limiting, and persons of skill in the art will understand that various other dielectric and conductor materials can also be substituted for the exemplary materials described.

FIGS. 2-7 are simplified schematic cross-sectional views of gate region 29 of MESFET device 20 such as is illustrated in FIG. 1, during different stages 102-107 of manufacture according to the prior art. Referring now to manufacturing stage 102 of FIG. 2, substrate 21 having GaAs containing Schottky forming region 211 and source-drain regions 23, 24 has been provided with dielectric layer 30 (e.g., silicon nitride) of thickness 301 and mask layer 32 (e.g., photo-resist) having opening 33 over Schottky forming region 211, extending to dielectric layer 30. Structure 202 results. In manufacturing stage 103 of FIG. 3, dielectric layer 30 is etched through opening 33 to expose surface 291 over Schottky forming region 211 of substrate 21. When layer 30 is of, for example, silicon nitride, etching of layer 30 is commonly performed by plasma dry etching with fluorine based chemistry, such as $SF_6$, $CHF_3$, $C_2F_6$, etc. Layer 30 is undercut so that edges 303 of opening 31 in layer 30 are recessed by amount 302 from edges 321 of opening 33 of mask layer 32. Structure 203 results wherein opening 31 now extends through layer 30 to surface 291 of substrate 21 in gate region 29.

Figure 4:
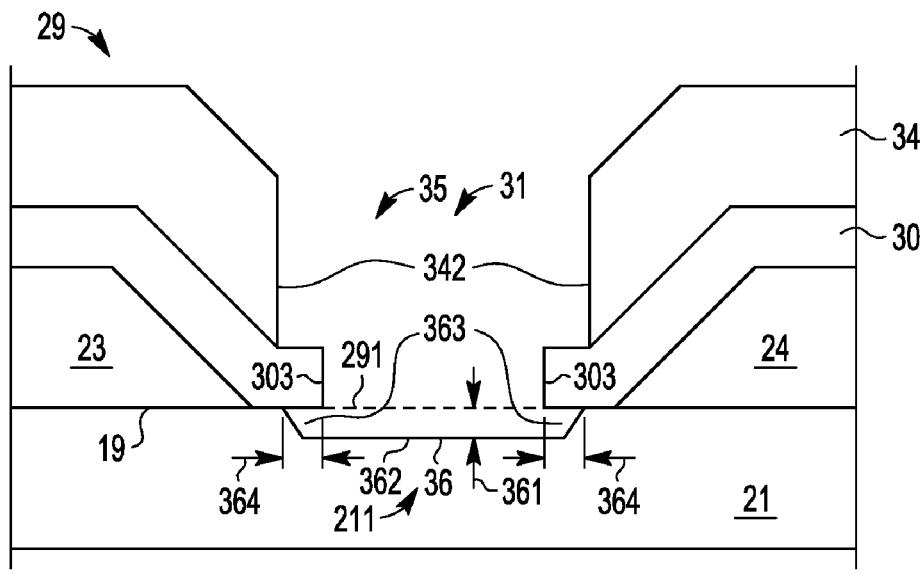

Referring now to manufacturing stage 104 of FIG. 4, mask layer 32 of structure 203 is conveniently removed in this embodiment and replaced by mask layer 34 (e.g., of photo-resist) having opening 35 often laterally somewhat wider than opening 31 between edges 303 of dielectric layer 30. Surface 291 of substrate 21 in gate region 29 is etched to provide recess 36 having depth 361 to newly exposed surface 362 and undercut regions 363 of lateral width 364 extending past edges 303 of opening 31 of layer 30. Recess 36 is generally included in HEMT devices since surface region 291 above Schottky forming region 211 often has higher than desired conductivity and is advantageously removed to expose lower conductivity surface 362 in recess 36 so a voltage subsequently applied to gate 27 (e.g., see FIG. 1) can more effectively control the current in channel 22 (e.g., see FIG. 1). Structure 204 results.

Figure 5:
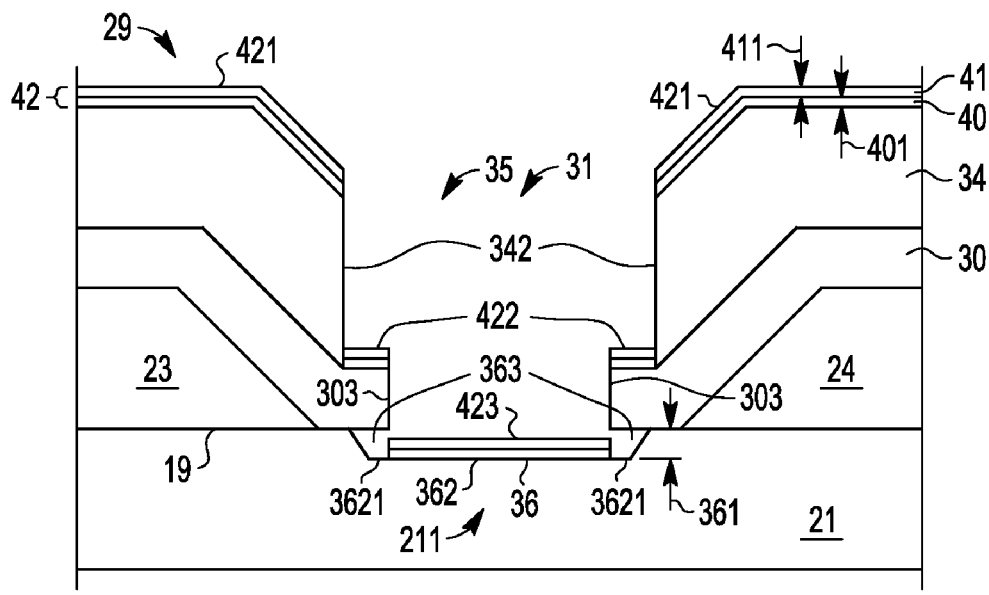

In manufacturing stage 105 of FIG. 5, conductive layer 40 of thickness 401 and conductive layer 41 of thickness 411 (collectively conductive layer 42) are deposited on structure 204. Layer 40 is desirably chosen for its ability to provide a Schottky contact to surface 362 exposed in recess 36 in substrate 21. Layer 41 is often included to prevent diffusion into the Schottky contact metal of a further conductor (e.g., conductor 272 shown in FIG. 1) that will be subsequently formed over layer 42. Where surface 362 of substrate 21 comprises GaAs, AlGaAs or other semiconductor material suitable as Schottky contact barrier layer, then Ti and TiW are useful for layer 40. Where the subsequent conductor (e.g., conductor 272 of FIG. 1) is Au, then Pt is useful for layer 41. Evaporation is a common deposition technique in these prior art devices and has the effect of providing portions 421 of layer 42 above the remaining parts of mask 34, portion 422 on those ledges of layer 30 exposed in opening 35 and portion 423 on surface 362 in recess 36. Since deposition by evaporation is conducted in a relatively hard vacuum, it is directional (usually approximately perpendicular to such surfaces) and little or no deposition takes place on substantially vertical sidewalls 342 of mask opening 35 in mask layer 34 and edges 303 in opening 31 of layer 30. This is generally referred to as non-conformal deposition. Most importantly, little or no material of layer 42 is deposited in undercut regions 363 of recess 36. These undercut regions 363 are also referred to as voids 363 and are present on both sides of Schottky contact gate electrode 423. Structure 205 results.

In manufacturing stage 106, conductor layer 44 of thickness 441 is provided over structure 205 of FIG. 5, for example by evaporation or plating or a combination thereof. Au is commonly used for layer 44. Thickness 441 should be large enough so that portion 442 of conductor layer 44 substantially fills opening 35 in mask layer 34 and opening 31 in dielectric layer 30. Structure 206 results. In manufacturing stage 107 of FIG. 7, a conventional lift-off process is used to remove remaining portions 346 (see FIG. 6) of mask layer 34 of structure 206 and overlying portions 421 of conductor layer 42 and overlying portions 444 of conductor layer 44, leaving behind portion 423 of layer 42 (e.g., forming conductor portion 271 of FIG. 1) and portion 442 of conductor 44 (e.g., forming conductor portion 272 of FIG. 1). Structure 207 results.

Figure 6:
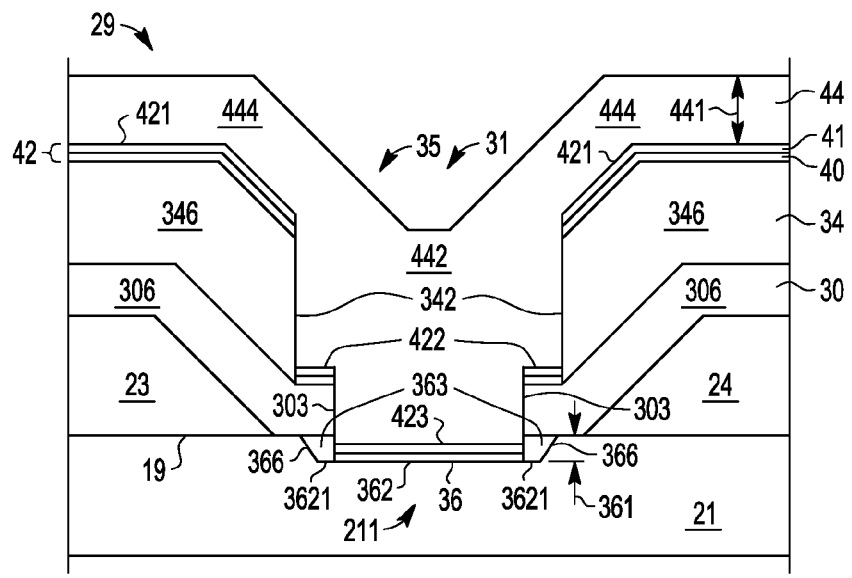
Figure 7:
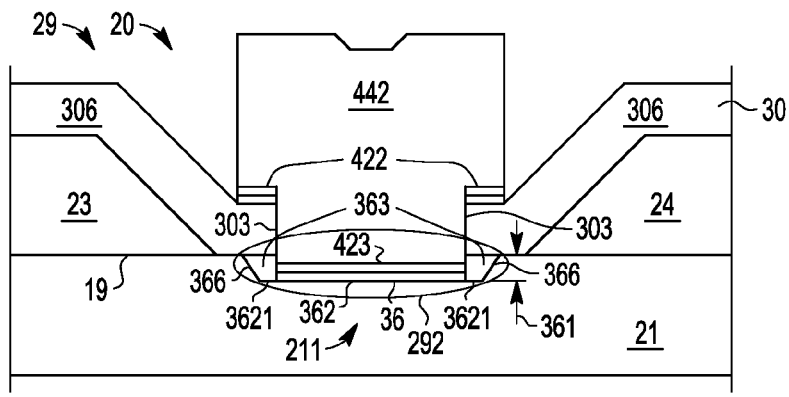
Figure 8:
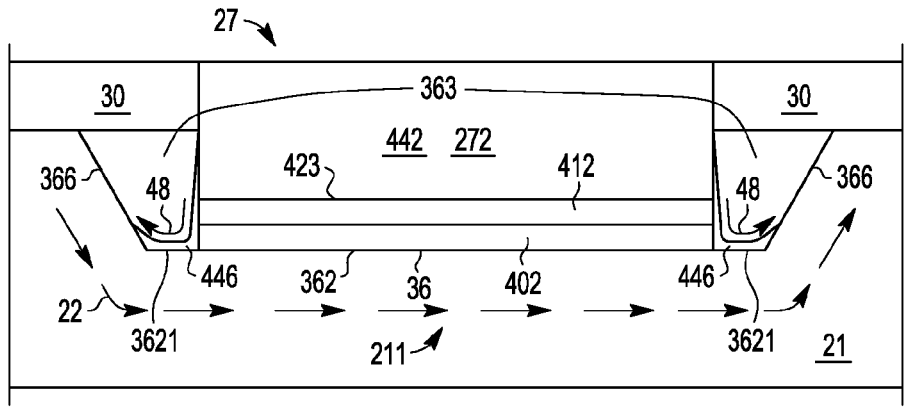
FIG. 8 is a simplified schematic cross-sectional view, somewhat enlarged, of the central portion of the MESFET of FIG. 7.

FIG. 8 is an enlarged simplified schematic cross-sectional view of central portion 292 of MESFET structure 207 of FIG. 7. Portion 423 of layer 42 in recess 36 comprises portion 402 of layer 40 and portion 412 of layer 41 in recess 36. Undercut voids 363 in recess 36 still remain. It has been found that the operating properties and reliability of devices constructed according to the prior art method illustrated in FIGS. 2-8 can degrade with time, especially when voltages are applied to gate 27, including portions 442, 272 in FIG. 8. It has further been found that a large portion of this degradation is caused by electro-migration of conductor 442 (e.g., 272 of FIG. 1) of gate 27 into voids 363 at the lateral edges of recess 36. The material of conductor 442, 272 moves as shown by arrows 48 into voids 363 so that portions 446 of conductor 442 migrate onto sidewalls 366 (and unpassivated portions 3621 of surface 362) of lateral undercut voids 363 associated with recess 36. Since the above-described prior art manufacturing process does not provide any significant passivation layer on sidewalls 366 of cavities 363 and on exposed unpassivated portions 3621 of surface 362 of recess 36, the presence of conductor, especially the gold metal from gate electrode conductor 442, in regions 446 can contaminate portions of substrate 21 near Schottky forming region 211 and substantially perturb the conductivity of channel 22 of device 20 formed by prior art manufacturing process steps 102-107 of FIGS. 2-7. This is undesirable.

Figure 9:
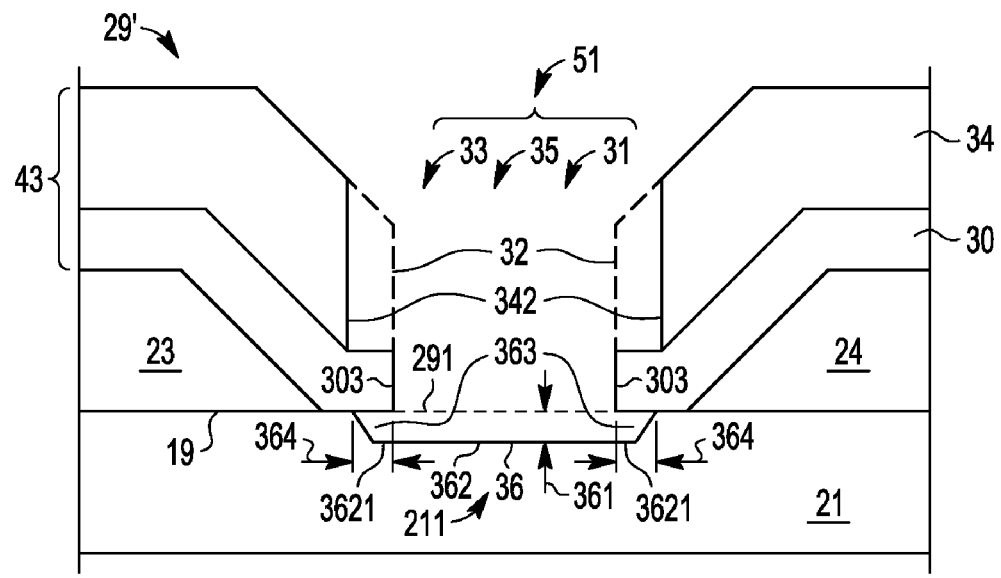
FIGS. 9-13 are simplified schematic cross-sectional views of the gate region of a MESFET device such as is illustrated in FIG. 1 during different stages of manufacture, but according to embodiments of the present invention.
Figure 12:
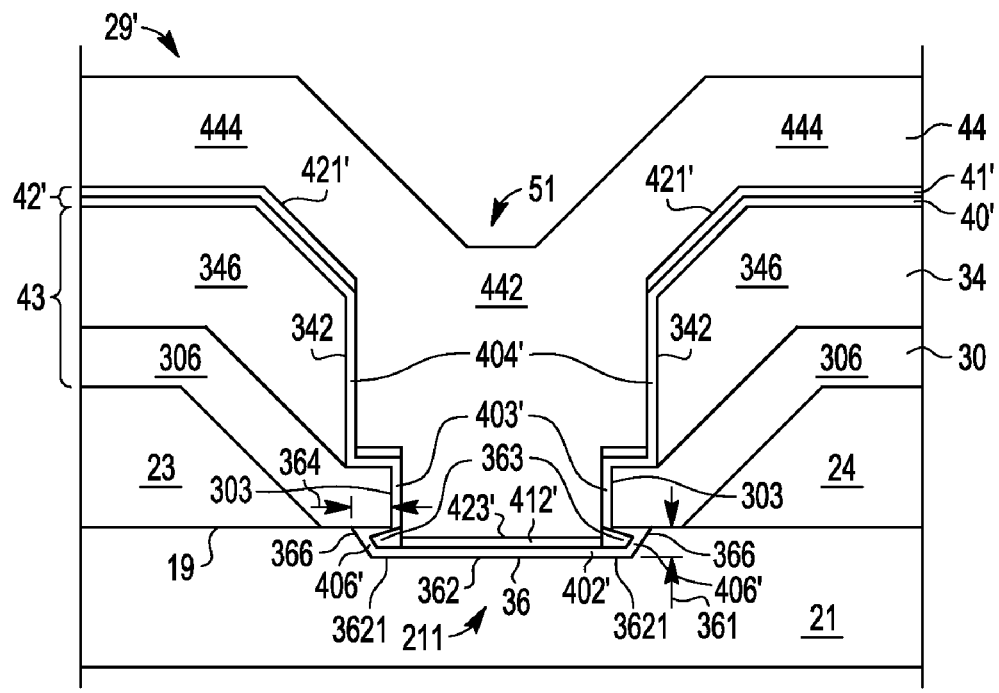
Figure 13:
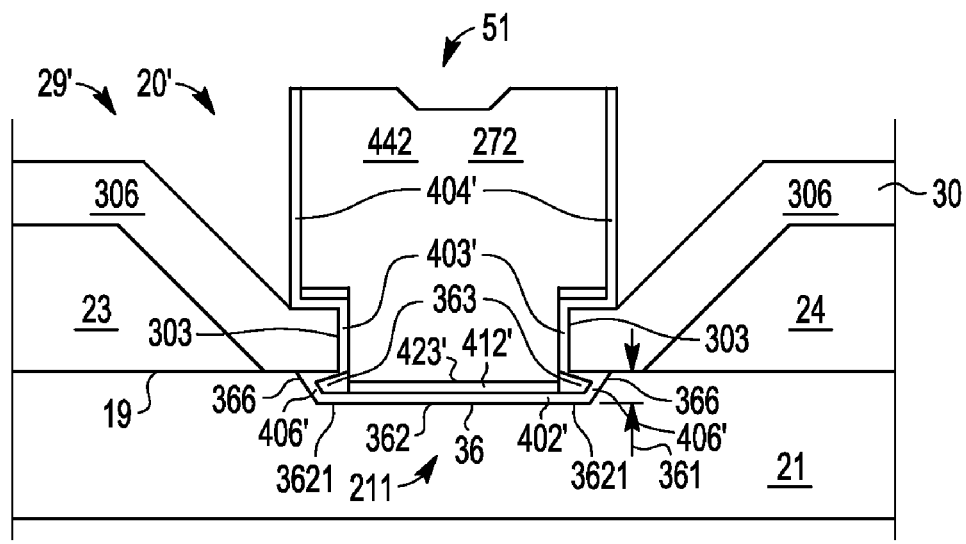
Figure 14:
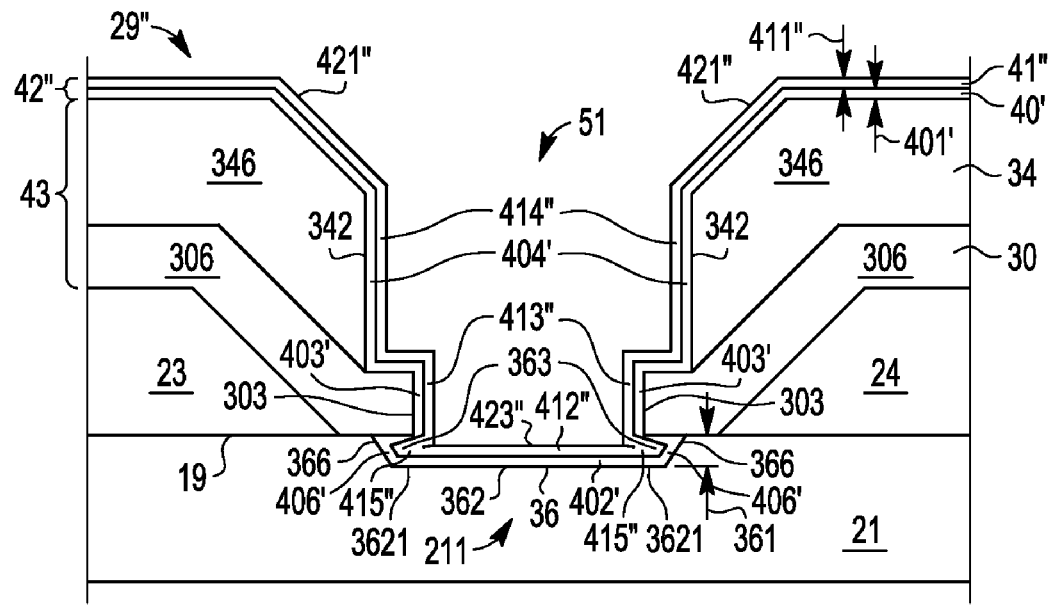
FIGS. 14-16 are simplified schematic cross-sectional views of the gate region of a MESFET device such as is illustrated in FIG. 1 during different stages of manufacture, but according to further embodiments of the present invention.
Figure 15:
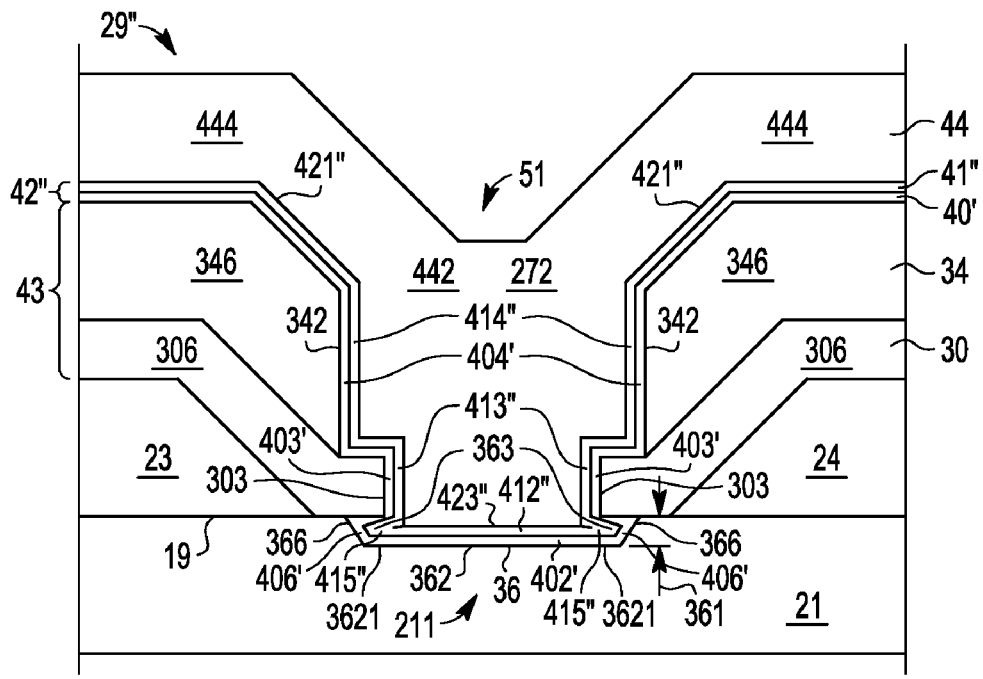
Figure 16:
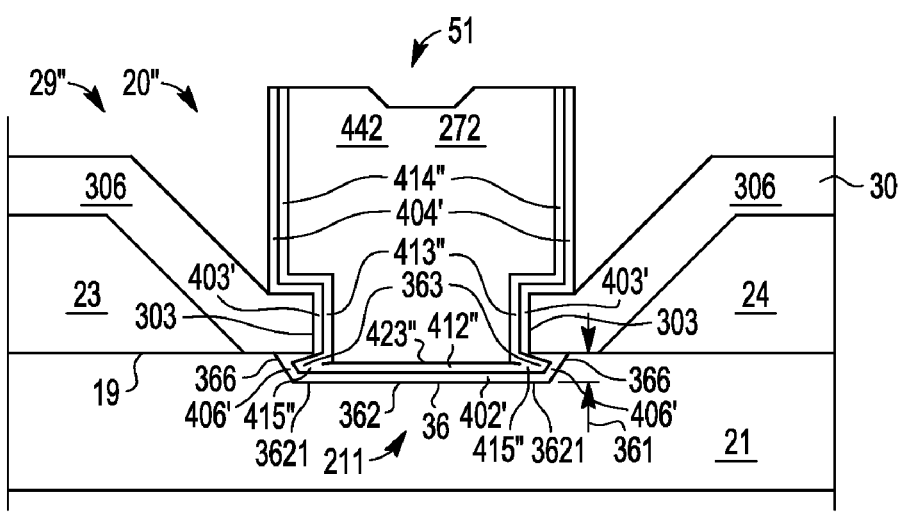

FIGS. 9-13 are simplified schematic cross-sectional view of gate region 29' of MESFET device 20' such as is illustrated in FIG. 1, during different stages 109-113 of manufacture according to embodiments of the present invention, and FIGS. 14-16 are simplified schematic cross-sectional view of gate region 29" of MESFET device 20" such as is illustrated in FIG. 1, during different stages 114-116 of manufacture according to still further embodiments of the present invention. FIGS. 9-13 and 14-16 are discussed together since they have aspects in common. Initially, the manufacturing stages are analogous to prior art manufacturing stages 102 through 103 of FIGS. 2-3. Manufacturing stage 109 of FIG. 9 is also generally analogous to prior art manufacturing stage 104 of FIG. 4 but can differ in important details. In various embodiments of manufacturing stage 109, mask layer 32 may be removed and replaced by mask layer 34, or removed and not replaced leaving dielectric layer 30 alone remaining, or layer 32 may be left in place and mask layer 34 omitted. Various combinations are illustrated in FIG. 9. Any of these configurations or arrangements is useful. What is important in manufacturing stage 109 is that either layer 30 and/or layer 32 and/or layer 34 or some combination is provided with opening 33 in layer 32, opening 31 in layer 30, and/or opening 35 in layer 34 so that surface 291 of substrate 21 is exposed in such opening(s), which opening(s) defines the lateral extent of the portion of surface 291 being etched to form recess 36. In the manufacturing steps in connection with the present invention it is assumed that layer 32 is replaced by layer 34, but this is merely for convenience of description of a preferred embodiment and, as noted above, it may be omitted in other embodiments. Thus, one or more of layers 30, 32, 34 with openings 31, 33, 35 singly or in combination are henceforth referred to as mask 43 with opening 51 in FIGS. 9-16. Mask 43 limits etching of the surface of substrate 21 to region or portion 291 beneath opening 51. As will become apparent in FIGS. 13 and 16, having opening 35 larger than opening 31 provides gate 27 (see FIGS. 1, 13 and 16) that is laterally wider at the top than at portion 271 of FIG. 1 or portion 423 of FIG. 13 or 423" of FIG. 16 in contact with surface 362 of substrate 21. Conversely, if mask 32 is retained, then gate 27 of FIG. 1 will have substantially the same lateral width at both top and bottom portions 272, 271.

In connection with manufacturing stage 109 of FIG. 9, it is desirable for embodiments of the present invention that depth 361 of recess 36 formed in manufacturing stage 109 be in the range of about 0 to 50 nanometers, more preferably in the range of about 0 to 20 nanometers, and preferably in the range of about 5 to 10 nanometers, but larger or smaller values may also be used. In general, the greater depth 361 of recess 36, the larger lateral undercut amounts 364. It is therefore desirable that lateral undercut amount 364 is in the range of about 0 to 200 nanometers, more preferably in the range of about 0 to 100 nanometers, and preferably in the range of about 0 to less than 50 nanometers, but larger or smaller values may also be used. Stated another way, it is desirable that lateral undercut amounts 364 be in the range of about 0 to less than 1000 percent of depth 361 of recess 36, more preferably in the range of about 0 to less than 500 percent of depth 361 and preferably in the range of about 0 to less than 200 percent of depth 361, but larger or smaller values may also be used. Stated still another way, the ratio R of lateral undercut amount 364 to depth 361 is usefully about 0 to less than 10, more conveniently about 0 to less than about 5 and preferably about 0 to less than about 2, but higher and lower ratios can also be used. Stated still yet another way, it is desirable that lateral undercut amount 364 be less than about 100 nanometers, but other values may also be used. Structure 209 results.

Figure 10:
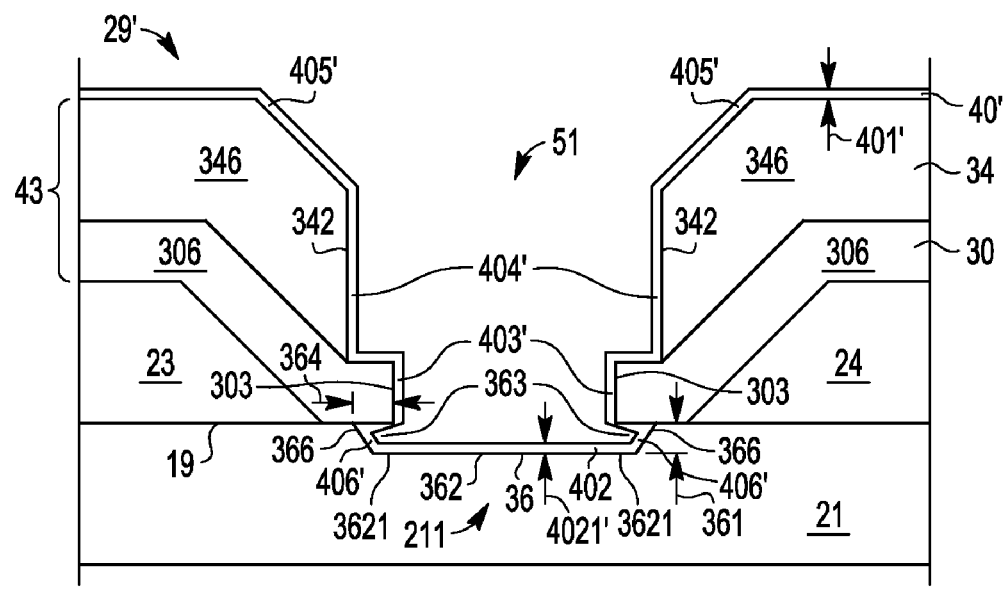

Structure 209 of FIG. 9 is then subjected to manufacturing stage 110 of FIG. 10, wherein layer 40' is conformally deposited over structure 209. Layer 40' is chosen of a material adapted to make a Schottky contact with surface 362 of recess 36. Ti, TiW, TiWN, WSi, and combinations of these types of refractory materials are non-limiting examples of suitable Schottky forming conductors for layer 40' when surface 362 comprises a III-V semiconductor, as for example and not intended to be limiting, GaAs, InGaAs, AlGaAs, or composites of these and other semiconductor materials or compounds. In further embodiments, especially in HEMT devices, it is desirable that the semiconductor material used for surface 362 have a higher band gap than the semiconductor material forming the conducting channel. More generally, layer 40' may be any conductor that is adapted to form a Schottky barrier with the semiconductor of surface region 362 of substrate 21. It is desired in various embodiments that the deposition process for forming layer 40' be substantially conformal so that portions 406' of the material of layer 40' form on the exposed portion 3621 of surface 362 and on sidewalls 366 of lateral undercut regions or voids 363 of recess 36. When a conformal deposition process is used, it is expected that the material of layer 40' will also deposit on sidewalls 303 in opening 31 of layer 30 and on sidewalls 342 in opening 35 of mask layer 34 and on the remainder of mask layer 34. It is desirable there should be a break or thin spot in layer 40', for example but not intended to be limiting, at the lateral edges of undercut regions 363 adjacent edges or sidewalls 303, to facilitate the removal of the portions of layer 40' over layer 34' during a subsequent lift-off operation. However, while deposition on these mask sidewall surfaces may occur, it is not important to the present invention. Any conformal deposition process may be used provided that portions 406' of layer 40' form on sidewalls 366 of cavity or recess 36 and on portions 3621 of surface 362 that would otherwise be shadowed by sidewalls 303 of mask or layer 43 defining opening 51. It is desirable that thickness 401' of layer 40', more accurately thickness 4021' of portion 402' of layer 40 in recess 36, be adjusted depending on depth 361 of recess 36. For example, it is desirable that thickness 401', 4021' of layer 40' be in the range of about 30% to 80% of depth 361, more conveniently in the range of about 40% to 60% of depth 361 and preferably about 50% of depth 361. Chemical vapor deposition (CVD) and plasma enhanced chemical vapor deposition (PECVD) and sputtering and combinations thereof are non-limiting examples of suitable conformal deposition processes. Sputtering is preferred. Suitable conditions for sputtering a conformal layer of, for example, Ti onto a GaAs containing substrate are DC sputtering, at a pressure of about 3 Torr in a flowing argon atmosphere, but other conditions, pressures, gases and materials can also be used. Low power sputtering is preferred so as not to inflict significant bombardment damage on exposed surface 362, which might otherwise degrade the conduction characteristics of channel 22 (see FIG. 1). Accordingly, sputtering power is desirably about $\leq$1000 Watts, more conveniently about $\leq$600 Watts and preferably about $\leq$400 Watts. Any sputtering process that provides low surface damage to semiconductor surface 362 can be used. The presence of a reactant or sputtering gas, even at the sub-atmospheric pressures used for CVD, PECVD and sputtering, promotes random motion of the depositing atoms and therefore improves conformal coating into lateral cavities or voids 363. Stated another way, it is desirable that deposition not occur in a substantially hard vacuum, where the term "hard vacuum" is intended to refer to a vacuum suitable for evaporation of conductor layers such as those illustrated herein. Structure 210 results.

Figure 11:
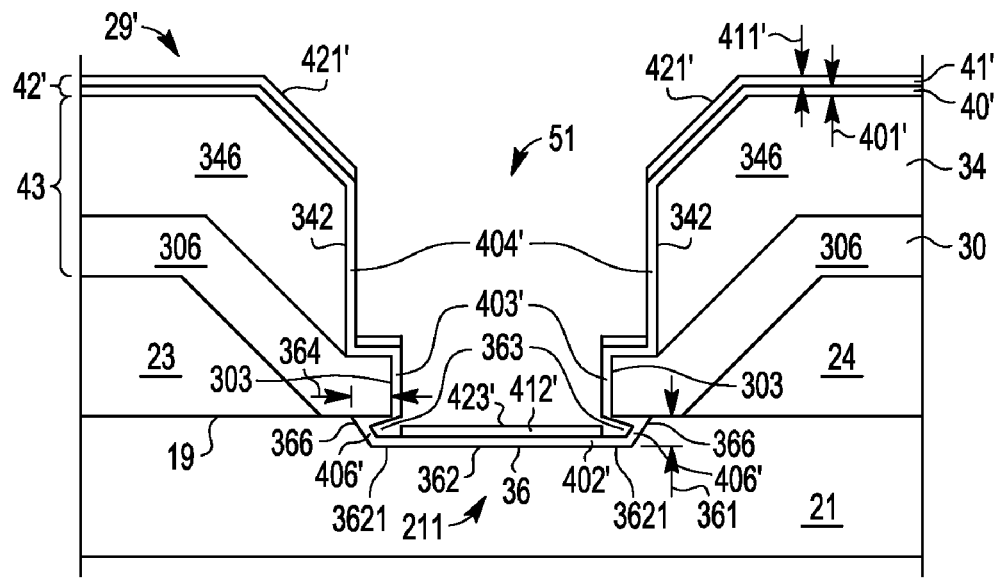

Referring now to manufacturing stage 111 of FIG. 11 and manufacturing stage 114 of FIG. 14, conductive barrier layer 41' (see FIG. 11) or conductive barrier layer 41" (see FIG. 14) is formed over conductor layer 40' of structure 210. Layers 40', 41' are collectively referred to as layer 42' and layers 40', 41" are collectively referred to as layer 42". In manufacturing stage 111 of FIG. 11, layer 41' is deposited non-conformally, as for example by vacuum evaporation, and in manufacturing stage 114 of FIG. 14, layer 41" is deposited conformally, e.g., by any of the conformal deposition process described in connection with manufacturing stage 110 of FIG. 10. Layer 41', 41" serves the same barrier function as described in connection with layer 41 of FIGS. 5-7, that is, to preclude or inhibit diffusion of conductor 442, 272 that will be subsequently applied in FIGS. 12 and 15 (see also FIG. 1) from diffusing into layer 40' and/or substrate 21. Where the subsequent conductor (e.g., conductor 442 of FIGS. 12 and 15 and 272 of FIG. 1) is Au, then Pt is useful for layer 41', 41". Palladium (Pd), Molybdenum (Mo), Tantalum (Ta) and Chromium (Cr), and combinations thereof, are further non-limiting examples of suitable barrier materials for layer 41', 41"; however other barrier materials may also be used. Layer 41', 41" should be sufficiently electrically conductive so as to not unduly increase the resistance of gate 27.

Referring now to manufacturing stage 111 of FIG. 11, portion 421' of layer 42' forms above portions 346 of mask layer 34 and portion 423' of layer 42' forms on surface 362 of substrate 21 and in cavity or recess 36 and, since layer 41' is formed non-conformally, substantially none of layer 41' forms on substantially vertical edges 404' and 403' or in undercut regions or voids 363. Referring now to manufacturing stage 114 of FIG. 14, portion 421" of layer 42" forms above portions 346 of mask layer 34 and portion 423" of layer 42" forms on surface 362 of substrate 21 (including portions 3621) and in cavity or recess 36 and, since layer 41" is formed conformally, portion 414" of layer 41" forms on substantially vertical portions 404' and portion 413" forms on substantially vertical portions 403' and portion 415" may form in undercut regions 363 to the extent that they are not already filled or blocked by portions 406 of layer 40'. Structure 211 results for substantially non-conformal layer 41' and structure 214 results for substantially conformal layer 41".

Referring now to manufacturing stage 112 of FIG. 12 and manufacturing stage 115 of FIG. 15, conductor layer 44 is formed on structures 211 and 214 respectively, in much the same manner as has already been described in connection with FIG. 6, the discussion of which generally also applies in connection with FIGS. 12 and 15. As previously noted, evaporated and/or plated Au is a suitable material for forming conductor 44 and conductor portion 442. Structure 212 and 215 result, respectively. In manufacturing stages 113 of FIGS. 13 and 116 of FIG. 16, portions 444 of layer 44 are lifted off along with portions 346 of mask layer 34, in much the same manner as already described in connection with manufacturing stage 107 of FIG. 7, the discussion of which generally also applies to manufacturing stages 113 and 116. However, resulting structures 213, 216 are different than prior art structure 207 due to the difference in formation of layers 42', 42". Specifically, in both structure 213 of FIG. 13 and structure 216 of FIG. 16, sidewalls 366 of lateral undercut regions 383 and otherwise unpassivated portions 3621 of surface 362 are covered by portion 406 of Schottky forming conductor 40' rather than remaining substantially bare as in prior art structure 207 of FIGS. 7 and 8. In FIG. 13, portion 423' of layer 42', comprises conformal portion 402' of layer 40' in Schottky contact with surface 362 of recess 36 and portion 406 on sidewalls 366 and portions 3621 of surface 362 of lateral undercut cavities 363 in substrate 21, are overlaid by non-conformal portion 412' of layer 41'. Portions 403' and 404' may remain attached (as shown) on lateral sides of conductor portion 442 above conductor portion 423' or in other embodiments may be removed during or after the lift-off procedure. Either arrangement is useful. In FIG. 16, portion 423" of layer 42", comprises conformal portion 402' of layer 40' in Schottky contact with surface 362 of recess 36 and portion 406 on sidewalls 366 and portions 3621 of surface 362 of lateral undercut cavities 363 in substrate 21, are overlaid by conformal portion 412" of layer 41". Portions 403', 413" and 404', 414" may remain attached (as shown) on lateral sides of conductor portion 442 above conductor portion 423" or in still other embodiments may be removed during or after the lift-off procedure. Either arrangement is useful. In both arrangements of structures 213 and 216, interior surfaces 366 and portions 3621 of surface 362 of lateral undercut cavities 383 are no longer exposed or unpassivated and subject to being perturbed by electro-migration of (e.g., Au) from conductor 442, 272 of gate 27. Thus, the cause of the instability, degradation and less than desirable reliability has been avoided. It will also be noted, that this is accomplished with minimal disturbance of the manufacturing process, specifically, substitution of generally available conformal deposition of the appropriate conductor layers in place of the prior art practice of using non-conformal deposition. This is a significant advance in the art not only because the adverse reliability, stability and performance problems have been avoided but because this is accomplished at little or no increase in the cost of manufacture of the finished devices.

According to a first embodiment, there is provided a method for forming a metal-semiconductor field effect transistor (MESFET) (20', 20"), comprising, providing a substrate (21) having a mask layer (43) thereon with an opening (51) extending to a surface region (291) of the substrate (21), etching a gate recess (36) in the surface region (291) of the substrate (21) so as to expose a depressed surface (362) of the substrate (21) and also form surface undercut cavities (363) extending laterally under the mask layer (43) from the gate recess (36), and substantially conformally coating the depressed surface (362) and inner surfaces (366) of the surface undercut cavities (363) with a Schottky forming conductor (40'), thereby forming a Schottky gate contact (271) to the substrate (21), adapted when biased to control current flow in a channel (22) underlying the gate recess (36). According to a further embodiment, the method further comprises forming a conformal or non-conformal barrier layer conductor (41', 41") over the Schottky forming conductor (40'). According to a still further embodiment, the method further comprises forming a comparatively thicker overlying gate conductor (442, 272) over the barrier layer conductor (41', 41"). According to a yet further embodiment, the comparatively thicker overlying gate conductor (442, 272) comprises Au. According to a still yet further embodiment, the comparatively thicker overlying gate conductor (442, 272) is formed by evaporation. According to a yet still further embodiment, the method further comprises forming a source (23) and a drain (24) region on the substrate (21) laterally separated from the gate recess (36) and the Schottky forming conductor (40') and adapted to communicate with the channel (22) underlying the gate recess (36). According to another embodiment, the source (23) and drain (24) are formed before or after the Schottky forming conductor (40'). According to a still another embodiment, the Schottky forming conductor (40') is formed by sputtering. According to a still yet another embodiment, wherein the gate recess (36) has a depth (361) and the surface undercut cavities (363) each have a lateral width (364) which is about 0 to 500 percent of the depth (361). According to a yet still another embodiment, wherein the gate recess (36) has a depth (361) and the surface undercut cavities (363) each have a lateral width (364) and a ratio R of the lateral width (364) divided by the depth (361) is about 0 to 10. According to another embodiment, the ratio R is about 0 to 5. According to a still another embodiment, the substrate (21) comprises one or more III-V semiconductors and the Schottky forming conductor (40') comprises Ti, TiW, TiWN, WSi or combinations thereof. According to a yet another embodiment, the gate recess (36) has a first depth (361) and the Schottky forming conductor (40') has a first thickness (401', 4021') and the first thickness (401', 4021') is about 30-80% of the first depth (361).

According to a second embodiment, there is provided a metal-semiconductor field effect transistor (MESFET) (20', 20"), comprising, a semiconductor substrate (21) having a gate region (29', 29") in which is located a surface portion (362) of the substrate (21) bordered by lateral undercut regions (363), and a Schottky contact forming conductor (40') overlying the surface portion (362) of the substrate (21) and on sidewalls (366) of the undercut regions (363). According to a still further embodiment, the undercut regions (363) have a first depth (361) substantially perpendicular to the surface portion (362) and the Schottky forming conductor (40') has a first thickness (401', 4021') substantially perpendicular to the surface portion (362) and wherein the first thickness (401', 4021') is 30% to 80% of the first depth (361). According to a yet further embodiment, the substrate comprises a III-V material. According to a still yet further embodiment, the surface portion (362) is located in a recess (36) in the substrate (21).

According to a third embodiment, there is provided a method for forming a gate conductor (27) of a metal-semiconductor field effect transistor (MESFET), comprising, providing a substrate (21) having a semiconductor first surface (291), applying a mask (43) having an opening (51) above the semiconductor first surface (291), etching the semiconductor first surface (291) through the opening (51) substantially vertically to a first depth (361) thereby exposing an interior surface (362) of the substrate (21) and substantially laterally underneath edges (303) of the mask (43) adjacent the opening (51) to a first distance (364), thereby forming a recess (36) having the interior surface (362) and lateral undercut regions (363) with sidewalls (366, 3521) shadowed by the edges (303) of the mask (43), and conformally depositing a Schottky forming conductor (40') of a first thickness (401', 4021') on the interior surface (362) and on the sidewalls (366, 3621) of the undercut regions (363). According to a further embodiment, the first thickness (401', 4021') is about 30% to 80% of the first depth (361). According to a still further embodiment, the Schottky forming conductor (40') is formed by sputtering.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a metal-semiconductor field effect transistor (MESFET), comprising:
    providing a substrate having a mask layer thereon with an opening extending to a surface region of the substrate;
    etching a gate recess in the surface region of the substrate so as to expose a depressed surface of the substrate and also form surface undercut cavities extending laterally under the mask layer from the gate recess; and
    substantially conformally coating the depressed surface and inner surfaces of the surface undercut cavities with a Schottky forming conductor that does not completely fill the surface undercut cavities, thereby forming a Schottky gate contact to the substrate, adapted when biased to control current flow in a channel underlying the gate recess.

2. The method of claim 1, further comprising, forming a non-conformal barrier layer conductor over the Schottky forming conductor, wherein the barrier layer conductor does not fill the surface undercut cavities.

3. The method of claim 2, further comprising, forming an overlying gate conductor over the barrier layer conductor, resulting in a MESFET in which the surface undercut cavities are at least partially defined by the barrier layer conductor and portions of the Schottky forming conductor coated on the inner surfaces of the surface undercut cavities.

4. The method of claim 3, wherein the overlying gate conductor is formed by evaporation.

5. The method of claim 1, further comprising forming a source and a drain region on the substrate laterally separated from the gate recess and the Schottky forming conductor and adapted to communicate with the channel underlying the gate recess.

6. The method of claim 5, wherein the source and drain are formed before or after the Schottky forming conductor.

7. The method of claim 1, wherein the Schottky forming conductor is formed by sputtering.

8. The method of claim 1, wherein the gate recess has a depth and the surface undercut cavities each have a lateral width which is about 0 to 500 percent of the depth.

9. The method of claim 1, wherein the gate recess has a depth and the surface undercut cavities each have a lateral width and a ratio R of the lateral width divided by the depth is about 0 to 10.

10. The method of claim 9, wherein the ratio R is about 0 to 5.

11. The method of claim 1, wherein the substrate comprises one or more III-V semiconductors and the Schottky forming conductor comprises Ti, TiW, TiWN, WSi or combinations thereof.

12. The method of claim 1, wherein the gate recess has a first depth and the Schottky forming conductor has a first thickness and the first thickness is about 30-80% of the first depth.

13. The method of claim 1, further comprising:
    forming a conformal barrier layer conductor over the Schottky forming conductor, so as to completely fill the surface undercut cavities with the Schottky forming conductor and the barrier layer conductor.

14. A metal-semiconductor field effect transistor (MESFET), comprising:
    a semiconductor substrate having a gate region in which is located a surface portion of the substrate bordered by lateral undercut regions;
    a Schottky contact forming conductor overlying the surface portion of the substrate and on sidewalls of the lateral undercut regions, wherein the Schottky contact forming conductor is conformally coated on the surface portion of the substrate and on the sidewalls of the lateral undercut regions and does not completely fill the lateral undercut regions.

15. The MESFET of claim 14, wherein the undercut regions have a first depth substantially perpendicular to the surface portion and the Schottky forming conductor has a first thickness substantially perpendicular to the surface portion and wherein the first thickness is 30-80% of the first depth.

16. The MESFET of claim 14, in which the surface portion is located in a recess in the substrate.

17. A method for forming a gate conductor of a metal-semiconductor field effect transistor (MESFET), comprising:
    providing a substrate having a semiconductor first surface;
    applying a mask having an opening above the semiconductor first surface;
    etching the semiconductor first surface through the opening substantially vertically to a first depth thereby exposing an interior surface of the substrate and substantially laterally underneath edges of the mask adjacent the opening to a first distance, thereby forming a recess having the interior surface and lateral undercut regions with sidewalls shadowed by the edges of the mask; and conformally depositing a Schottky forming conductor of a first thickness on the interior surface and on the sidewalls of the lateral undercut regions, wherein the Schottky forming conductor does not completely fill the lateral undercut regions.

18. The method of claim 17, wherein the first thickness is about 30% to 80% of the first depth.

19. The method of claim 17, wherein the Schottky forming conductor is formed by sputtering.

20. A metal-semiconductor field effect transistor (MESFET), comprising:

a semiconductor substrate having a gate region in which is located a surface portion of the substrate bordered by lateral undercut regions;

a Schottky contact forming conductor overlying the surface portion of the substrate and on sidewalls of the lateral undercut regions, wherein the Schottky contact forming conductor does not completely fill the lateral undercut regions;

a barrier layer conductor overlying the Schottky forming conductor, wherein the barrier layer conductor also does not completely fill the lateral undercut regions; and an overlying gate conductor over the barrier layer conductor, wherein the lateral undercut regions are at least partially defined by the overlying gate conductor, the barrier layer conductor, and portions of the Schottky forming conductor formed on the sidewalls of the lateral undercut regions.

* * * * *